United States Patent
Jones et al.

(10) Patent No.: US 8,411,799 B1
(45) Date of Patent: Apr. 2, 2013

(54) RECEIVER WITH INTERMEDIATE FREQUENCY ERROR CORRECTION

(75) Inventors: Theron L. Jones, White Heath, IL (US); Andrew Zocher, Monticello, IL (US); Luiz Antonio Razera, Jr., San Jose, CA (US); Lawrence Rankin Burgess, Saratoga, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 547 days.

(21) Appl. No.: 12/618,541

(22) Filed: Nov. 13, 2009

(51) Int. Cl.
*H03D 3/00* (2006.01)

(52) U.S. Cl. ........ 375/334; 375/215; 375/316; 375/322; 375/327; 375/339

(58) Field of Classification Search .................. 375/136, 375/147, 215, 269, 272, 294, 316, 322.327, 375/334, 339, 344, 376, 322, 327
See application file for complete search history.

(56) References Cited

U.S. PATENT DOCUMENTS

| | | | | |
|---|---|---|---|---|
| 6,064,867 A * | 5/2000 | Takemoto | ................... | 455/192.2 |
| 6,335,953 B1 * | 1/2002 | Sanderford et al. | .......... | 375/344 |
| 7,272,178 B2 * | 9/2007 | Rahman et al. | ................ | 375/240 |
| 7,352,831 B2 * | 4/2008 | Quinlan et al. | ................ | 375/344 |
| 7,567,644 B2 * | 7/2009 | Wagner | .......................... | 375/376 |
| 7,756,500 B1 * | 7/2010 | Fulga et al. | ................... | 455/266 |
| 8,295,403 B2 * | 10/2012 | Chan et al. | ..................... | 375/327 |
| 2002/0127984 A1 * | 9/2002 | Barak | ......................... | 455/183.2 |
| 2004/0153879 A1 * | 8/2004 | Fukutani et al. | ................ | 714/48 |
| 2005/0221779 A1 * | 10/2005 | Okanobu | .................... | 455/253.2 |
| 2008/0070539 A1 * | 3/2008 | He et al. | ........................ | 455/305 |
| 2008/0101481 A1 * | 5/2008 | Al-Eidan | ...................... | 375/260 |
| 2009/0207943 A1 * | 8/2009 | Ogawa et al. | ................. | 375/327 |

* cited by examiner

*Primary Examiner* — Hirdepal Singh
(74) *Attorney, Agent, or Firm* — TIPS Group

(57) ABSTRACT

A receiver having an intermediate frequency error correction circuit includes a mixer having a source input, a local oscillator input, and an IF output, an adjustable frequency local oscillator having an output coupled to the local oscillator input of the mixer, an IF filter having an input coupled to the IF output of the mixer and an IF filtered output, where the IF filter has an IF filter frequency response, and control circuitry coupled to the local oscillator such that the frequency of the local oscillator can be varied to at least: partially correct an IF frequency error.

12 Claims, 3 Drawing Sheets

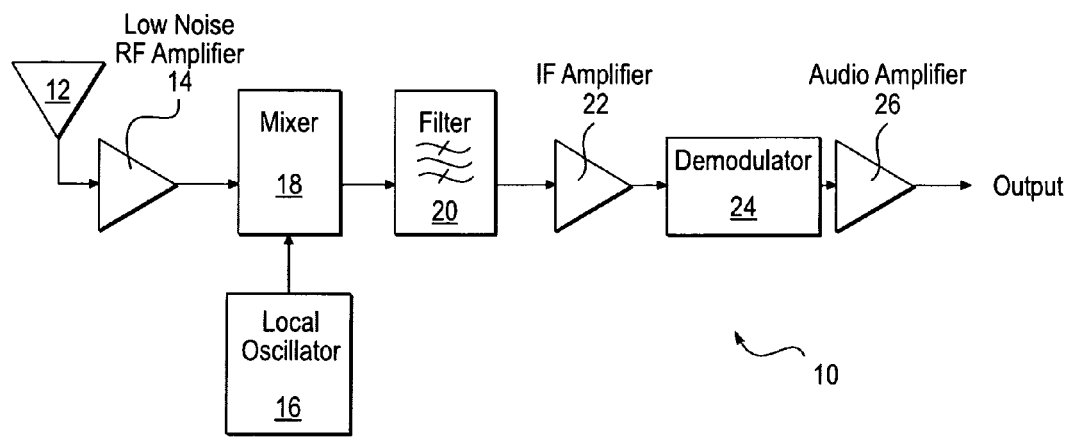
FIG. 1A
(Prior Art)
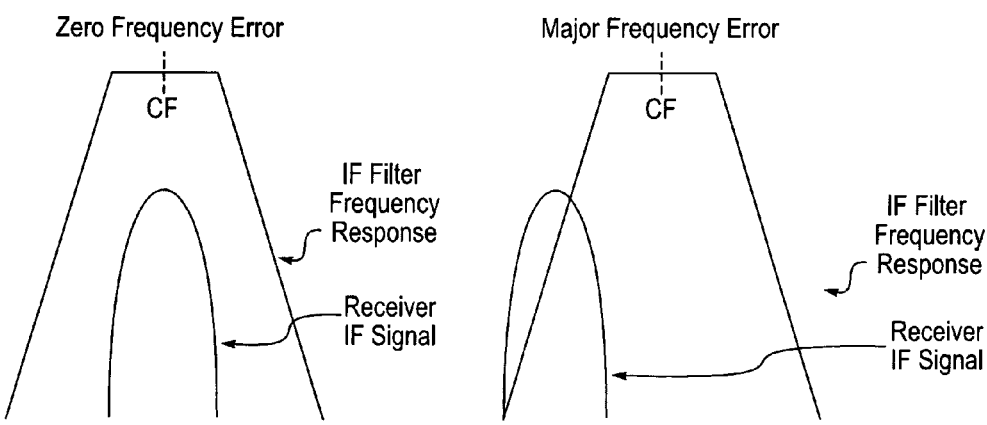
FIG. 1B
(Prior Art)
FIG. 1C
(Prior Art)

RECEIVER WITH INTERMEDIATE FREQUENCY ERROR CORRECTION

BACKGROUND

Low power, short range remote control has had historical usages with, for example, garage door openers. Such remote controls often include simple, low cost digital transmitter/receiver pairs operating in the unlicensed industrial, scientific and medical ("ISM") radio bands. An ISM radio band frequently used in the prior art was in the 270-470 MHz range.

Garage door openers and other types of simple, digital remote control systems have used saw-based oscillator transmitters having simple on/off key encoding. The transmitters typically operated in the 270 MHz to 470 MHz frequency range and had an operable distance range of approximately 50 to 100 feet at permissible power levels.

It has been desirable to keep the power requirements of such devices low, particularly with respect to the transmitter, and to use simple, discrete circuitry to keep down costs. For example, the circuitry of a traditional remote control may be comprised of a few transistors and passive components. The receivers traditionally were of an inexpensive super-regenerative design with wide bandwidths, e.g. 2-3 MHz. However, because of their wide bandwidths, the signal-to-noise ratio (SNR) of such receivers was fairly low, placing a limit on their effective range.

It will therefore be appreciated that remote controls of the prior art, while being inexpensive, suffered from the problems of having a very short effective range. Most methods for extending operation distance range of such super-regenerative designs were focused on the transmitter. For example, the power of the transmitter could be increased or a higher-quality antenna could be used. However, the battery operation and typically small size of remote control transmitters often work against such solutions as well as power restrictions in operating in the ISM radio bands. For example, remote controls for automobile door locks are often the size of key fobs and have very small batteries and limited room for an antenna. There is therefore a move in the industry to upgrade the prior art super-regenerative receivers to a more sensitive superheterodyne receiver design.

Superheterodyne receivers, while generally superior to super-regenerative receivers, require relatively expensive crystals and integrated circuits. Despite the additional costs, superheterodyne receivers tend to be favored because they have frequency resolutions which are an order of magnitude better than those of super-regenerative receivers. For example, where a super-regenerative receiver might have a pre-demodulation bandwidth of 3 MHz, a superheterodyne receiver might have a pre-demodulation bandwidth of 300 KHz. The lower pre-demodulation bandwidth of the superheterodyne receiver greatly increases the SNR of the received signal, increasing the effective range of the remote control or remote monitoring device.

The greater effective range afforded the superheterodyne receiver comes, as noted above, at the cost of relatively more expensive circuitry. For example, both the transmitter and the receiver of the remote control require crystals and an integrated circuit. Nonetheless, there is a continuing desire to increase the effective range of remote control and/or monitoring systems such as for automatic meter reading (AMR), remote keyless entry (RKE) for automobiles, and home automation.

One trend is to operate in a higher ISM radio band in order to increase effective range. For example, there is continuing investigation to use higher frequency ISM bands, e.g. 800-900 MHz. This is because operating at higher frequencies allows for a shorter, higher quality antenna to fit within the size constraints of the transmitter. A higher quality antenna will typically result in an increased effective range.

The user of higher frequencies in superheterodyne receivers present new problems, one of which is crystal resonance frequency "error", e.g. any factor (such as tolerance, aging, drift, temperature effects, etc) which causes a crystal to have a resonant frequency other than that which is desired. As used herein, "error" will mean any deviation from the desired resonance frequency of the crystal. As the crystal frequency drifts or otherwise moves from a desired frequency to create a crystal frequency error, the PLL which uses it as a reference will also be subject to a proportional frequency error. For example, when superheterodyne receivers are operated in the 270-470 MHz range, a crystal induced local oscillator frequency error of up to about 50 KHz is acceptable. However, with higher frequency operation and/or narrower intermediate frequency ("IF") bandwidth utilized to further increase range, the frequency tolerance and temperature coefficients of the crystals must be much better, often requiring expensive compensated crystals at both the receiver and the transmitter.

This problem will be explained in greater detail with references to FIGS. 1A, 1B and 1C. In FIG. 1A, an example superheterodyne receiver 10 includes an antenna 12 and a low noise RF amplifier 14 for amplifying the signal detected on antenna 12. A local oscillator 16, which includes the crystal, has an output which is mixed with the output of the RF amplifier 14 in a mixer 18. The output of the mixer 18 is filtered in filter 20 and then amplified in an IF amplifier 22. The output of the IF amplifier 22 is demodulated in demodulator 24 and the resultant audio amplifier 26 creates the output for the receiver 10.

As noted above, at higher frequency operation the absolute error of the local oscillator frequency becomes proportionally larger compared to receivers operating at lower frequencies. As seen in FIG. 1B, the circuitry of FIG. 1A operates well when the IF signal is fully within the IF filter frequency response of the receiver. However, with crystal error, the intermediate frequency of the signal can shift such that the IF signal is no longer within or fully within the IF filter frequency response. Furthermore, the transmitter and receiver crystal-based errors are cumulative. This "major frequency error" problem is illustrated in FIG. 1C.

A partial solution to crystal error is to use expensive, high quality compensated and/or temperature characterized crystals. An example of this is to use an external temperature compensated crystal oscillator (TCXO). However, this solution is undesirable to manufacturers who wish to keep the manufacturing costs of the devices as low a possible. It would therefore be desirable to find a solution to the crystal error problem which allows the use of relatively low cost crystals in both the transmitter and receiver of remote control and/or monitoring devices.

These and other limitations of the prior art will become apparent to those of skill in the art upon a reading of the following descriptions and a study of the several figures of the drawing.

SUMMARY

The following summary of example embodiments are set forth by way of example and not limitation. As will be appreciated by those skilled in the art, the following examples are not exhaustive of all embodiments as disclosed herein.

In an embodiment, set forth by way of example and not limitation, a receiver having an intermediate frequency ("IF")

error correction circuit includes a mixer, an adjustable frequency local oscillator, an IF filter, and digital controller circuitry. The mixer, in this example, has a source input, a local oscillator input, and an IF output which is related to a difference between the frequency of signals applied to the source input and the local oscillator input. The adjustable frequency local oscillator has an output coupled to the local oscillator input of the mixer. The IF filter has an input coupled to the IF output of the mixer and has a filtered output. The control circuitry is coupled to the local oscillator such that the frequency of the local oscillator may be varied to at least partially correct an IF frequency error. The digital controller circuitry, by way of example and not limitation, may include a demodulator coupled to the output of the IF filter, an averaging circuit coupled to an output of the demodulator, an ADC coupled to the output of the averaging, circuit, and a digital controller coupled to an output of the ADC.

In an embodiment, set forth by way of example and not limitation, a method to aid in a frequency calibration of an IF stage includes the acts of providing a calibration signal, demodulating the calibration signal, creating a digital calibration value, and storing the calibration value in digital memory. For example, the calibration signal can have a frequency at about a center frequency of a bandpass filter of an IF stage. The demodulation of the calibration signal can, for example, be accomplished in an Frequency Shift Keying ("FSK") demodulator of an IF stage to develop an output signal corresponding to the center frequency. An ADC can be used to develop the digital calibration value corresponding to the FSK output and the calibration value can be stored in digital memory. By way of example and not limitation, a calibration value can be stored in a register of a digital controller.

In an embodiment, set forth by way of example and not limitation, a method to calibrate an IF stage includes demodulating an IF signal, developing a center signal, developing a digital center value, and adjusting the frequency of a local oscillator to calibrate the IF stage. The IF signal can be demodulated by, for example, an FSK demodulator in an IF stage of a receiver. The center signal is, in this example, related to the demodulated output signal and represents a center frequency of the demodulated output signal. The digital center value can be developed in an ADC, and the frequency derived from the local oscillator can be under microcontroller control.

These and other embodiments and advantages and other features disclosed herein will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the various embodiments disclosed herein. The drawings include the following figures:

FIG. 1A is a block diagram of a prior art superheterodyne receiver;

FIG. 1B illustrates a zero frequency error between an IF signal and an IF filter frequency response;

FIG. 1C illustrates a major frequency error between an IF signal and an IF filter frequency response;

DETAILED DESCRIPTION OF EXAMPLE EMBODIMENTS

Figure 2:
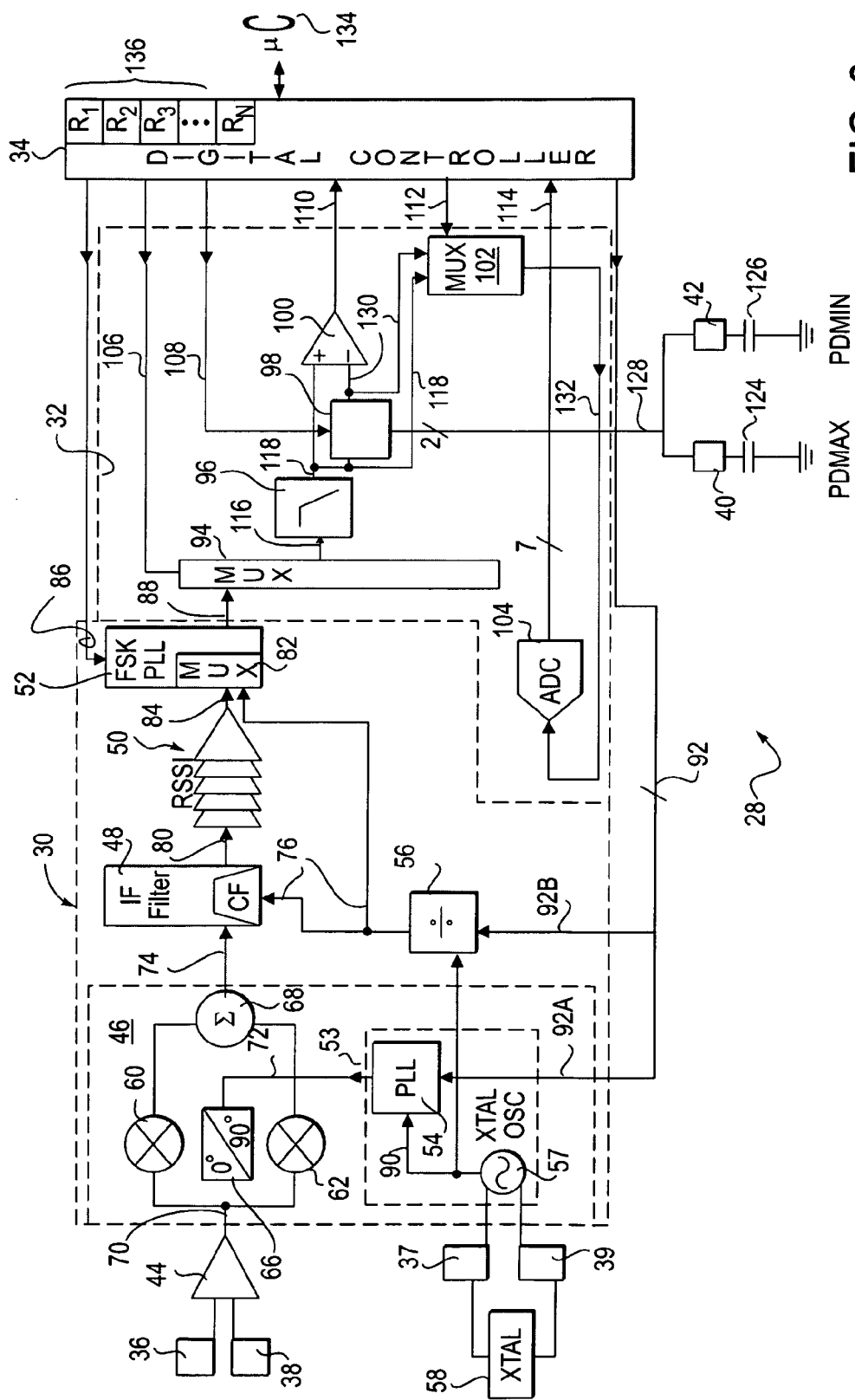
FIG. 2 is a block diagram of an example receiver implementing intermediate frequency error correction.

FIGS. 1A, 1B and 1C were discussed with reference to the prior art. FIG. 2 is an embodiment, set forth by way of example and not limitation, of a superheterodyne receiver 28 having intermediate frequency error correction. The receiver 28 includes an intermediate frequency stage 30, a digitization stage 32 and a digital controller 34. The superheterodyne receiver 28 may form a part of an integrated circuit along with other circuitry, as will be appreciated by those skilled in the art. In such an example, I/O pins 36, 37, 38, 39, 40 and 42 may represent leads of an integrated circuit.

In this example embodiment, I/O pins 36 and 38 can be coupled to a radio frequency source such as an antenna. An amplifier 44 is used to boost the signal from the antenna. Preferably, the amplifier 44 is a broadband, low noise amplifier ("LNA").

The IF stage 30 includes a heterodyne stage 46, an IF filter 48, a limiting amplifier 50 (represented here, by way of example and not limitation, by received signal strength indication or "RSSI" stage), a demodulator 52 and a frequency divider 56. The heterodyne stage 46 further includes a local oscillator 53 having, in this example embodiment, a phase lock loop ("PLL") 54 and a crystal oscillator 57. In this example, a crystal 58 is provided off-chip and is connected to the oscillator by I/O pins 37 and 39.

As will be appreciated by those skilled in the art, the heterodyne stage 46 is of conventional design also includes two mixers 60 and 62, a phase shifter 66 and a summer 68. As will also be appreciated by those skilled in the art, this heterodyne stage includes image rejection which rejects one of the two sidebands developed by the heterodyne process. The input to the heterodyne stage 46 includes the amplified antenna input 70 and the local oscillator signal 72. The output of the heterodyne stage 46 is the raw, unfiltered. IF signal on a line 74.

The IF filter 48 is, in this example, a standard bandpass filter having a transfer characteristic as illustrated, for example, by FIGS. 1B and 1C. That is, it has a center frequency CF which, in an ideal case, is also the center frequency of the IF signal on output line 74 of the heterodyne stage. The IF filter 48 has, as inputs, line 74 and an input coupled to an output of frequency divider circuit 56 to provide the center frequency CF. The output of IF filter 48 is developed on line 80. It will be appreciated by those of skill in the art that the example RSSI implementation of limiting amplifier 50 is well suited to the task of being a limiting amplifier, but that other limiting amplifier designs are also suitable.

Demodulator 52, in this embodiment, is an FSK PLL demodulator having an integrated multiplexer ("MUX") 82, although the MUX 82 can also be a separate device or circuit. As will be appreciated by those skilled in the art, frequency shift keying ("FSK") is a frequency modulation technique in which digital information is transmitted through discrete changes of a carrier wave. The simplest FSK is binary FSK ("BFSK") which uses two discrete frequencies to transmit binary (0's and 1's) information. With this technique, the "1" is called the "mark" frequency and the "0" is called the "space" frequency.

The demodulator 52, in this example, is therefore designed to remove the FSK binary data stream from the IF signal. The MUX 82 has a first input coupled to the output 84 of the RSSI 50 and a second input coupled to the output 76 of the frequency divider 56. The demodulator 52 also has a digital controller input 86 and an output 88 which includes the demodulated BSFK data in analog form.

The PLL 54 has, as inputs, the output 90 of the crystal oscillator 57 and a PLL control line 92A. The PLL control line 92A is derived from a control bus 92 which includes PLL control line 92A and a divider control line 92B. The control bus 92 is coupled to outputs of digital controller 34. The PLL 54 is a high quality PLL capable of being tuned over a relatively wide bandwidth in small steps. By way of example and not limitation, the PLL 54 could be tunable from about 100 MHz into the Gigahertz range in relatively small steps, e.g., 300 Hz per step. The operation of tunable PLL 54 will be described in greater detail subsequently.

The frequency divider 56 divides the output signal from the crystal oscillator 57 down to the center frequency CF. By way of example and not limitation, this center frequency CF may be approximately 50 KHz. As will also be discussed subsequently, the output 76 of the divider 56 will also be used to provide a calibration signal to calibrate the IF filter 48.

Digitization stage 32 includes a MUX 94, a low-pass filter 96, a threshold generator 98, a comparator 100, a MUX 102, and an analog to digital converter ("ADC") 104. The digitization stage 32 communicates with the IF stage 30 via output 88 of the demodulator 52 and communicates with the digital controller 32 via lines 106-114.

The MUX 94 has a number of inputs, one of which is coupled to output 88 of demodulator 52. The other inputs are not relevant for the present discussion. MUX 94 is controlled by line 106 which is an output of digital controller 34. The output of MUX 94 is at 116. The low-pass filter 96 has, as an input, the output 116 of MUX 94 and has an output line 118. The purpose of the low pass filter ("LPF") is to improve the signal by attenuating high frequency noise thereby increasing the signal to noise ratio ("SNR") of the output line 118. Depending upon the application, the LPF is optional and may be omitted.

Threshold generator 98 has, as inputs, the output 118 of the (optional) LPF 96 and line 108 from digital controller 34. The threshold generator 98 is also coupled to I/O pins 40 and 42 and to external capacitors 124 and 126, respectively, by a bus 128. The threshold generator 98 provides an output on a line 130 which is, essentially, an average of the signal on line 118. The threshold generator 98 will be discussed in greater detail with reference to FIG. 4.

The comparator 100 has, in this example embodiment, a "+" input coupled to line 118 and a "−" input coupled to line 130. The output of the comparator 100 is coupled to line 110. MUX 102 has, as inputs, lines 118 and 130 and is controlled by line 112. The output of MUX 102 is on line 132 which is coupled to an input to analog to digital converter (ADC) 104. An output of ADC 104 is coupled to line 114.

Digital controller 34 is coupled to the aforementioned lines 86 and 106-114 and bus 92. Digital controller 34, in this example embodiment, is designed to be coupled to an off-chip microcontroller 134. Alternatively, the functionality of the microcontroller 134 can be provided on-chip as will be appreciated by those skilled in the art. The digital controller 34 therefore serves as an interface between programmable controllers (such as a microcontroller or microprocessor) and components of the superheterodyne receiver 28. The digital controller will preferably includes a number of registers 136, discrete logic, state machines, etc., although other forms of digital circuitry may be suitable as will be appreciated by those of skill in the art.

An example demodulator 52 will be discussed in greater detail with reference to FIG. 3. In this example embodiment, the demodulator 52 includes the analog MUX 82 and an FSK demodulator (PLL) 138. The PLL 138 includes a phase-frequency detector 140, a charge pump 142, a loop filter 144, and a voltage controlled oscillator ("VCO") 146. With additional reference to FIG. 2, the inputs to analog MUX 82 are the filtered, limited IF signal from the RSSI output on line 84, the center of channel signal from the divided crystal oscillator reference frequency on line 76, and a control line 148 from a control bus 86 coupled to the digital controller 34. The digital controller 34 then controls the analog MUX 82 to output either the signal on line 84 or the signal on line 76 on output line 150.

The phase-frequency detector 140 of the FSK demodulator (PLL) 138 is coupled to line 150 of the analog MUX 82. An output line 152 is coupled to charge pump 142 which has an output on a line 154 which is coupled to an input of the loop filter 144. The output of the loop filter on line 88 comprises the output of the demodulator 52. However, line 88 is also an input to the VCO 146 which provides an output on a line 158 for the phase-frequency detector 140.

Figure 3:
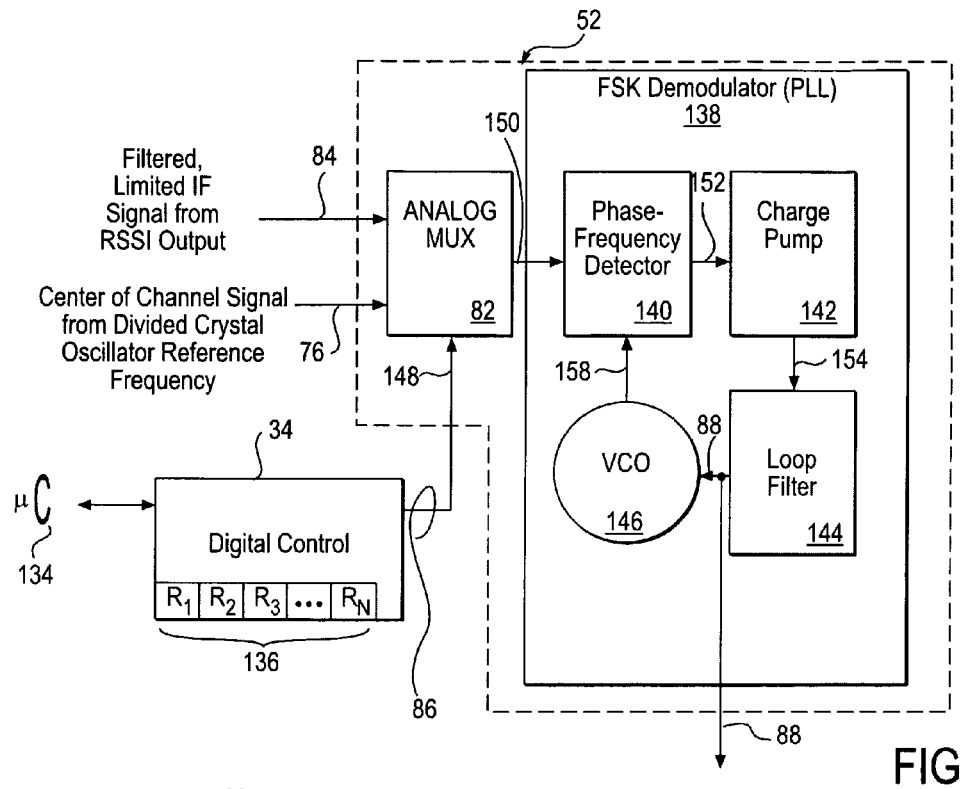
FIG. 3 is a block diagram of an example FSK PLL demodulator of FIG. 2.

It will therefore be appreciated that the demodulator 52 as illustrated in FIG. 3 is a conventional FSK demodulator circuit which is implemented as a phase lock loop ("PLL"). It will also be apparent to those of skill in the art that other demodulators can be used including those which do not use phase lock loops. However, the example embodiment of FIG. 3 is advantageous in that it is inexpensive and straightforward to implement and can demodulate the IF signal with good accuracy.

Figure 4:
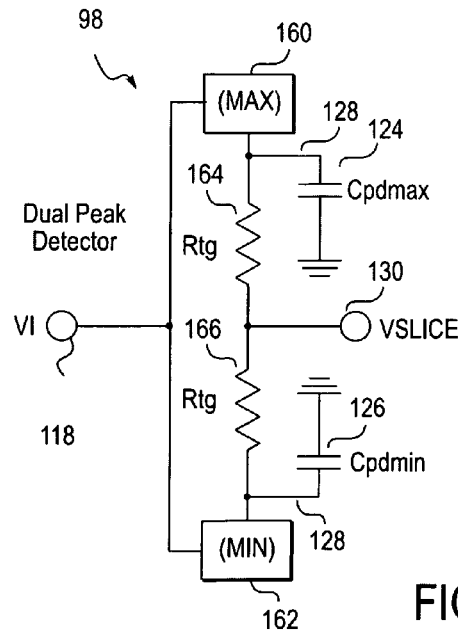
FIG. 4 is a block diagram of an example threshold detector of FIG. 2.

FIG. 4 is an example embodiment of a threshold generator 98 of FIG. 2. In this example embodiment, the threshold generator develops a threshold voltage VSLICE which is an average of the minimum and maximum signal on line 118. As noted previously, this signal on 118 is the analog representation of the data that had been transmitted to receiver. Therefore, the voltage VSLICE is an average between the "space" voltage level and the "mark" voltage levels corresponding to a "0" and a "1", respectively. As will be appreciated by those of skill in the art, other averaging circuits may also be suitable.

The VSLICE signal is derived by applying the signal on line 118 simultaneously to a MAX peak detector 160 and a MIN peak 162. The output of MAX peak detector 160 is on line 128 which is coupled to external capacitor 124. The line 128 is also coupled to a resistor 164. Similarly, the output of MIN peak detector 162 is coupled to line 128 which is coupled to external capacitor 126. Line 128 is also coupled to a resistor 166. Resistors 164 and 166 are coupled together at line 130 where the VSLICE voltage is developed.

It will therefore be appreciated that the threshold generator 98, in this example embodiment with a FSK demodulator, develops a threshold signal which is approximately one-half way between the voltage level which designates a "1" or "mark" and the voltage level which represents a "0" or "space." The VSLICE voltage level or "threshold" is therefore typically one half way between the "1" or "mark" and the "0" or "space" voltage levels. For signal voltages above VSLICE, the signal is considered to be a "1" or "mark" and for signal voltages below VSLICE, the signal is considered to be a "0" or "space."

As will be appreciated by those of skill in the art, if an ASK signal is demodulated in the FSK demodulator, a single frequency will be derived and the threshold generator 98 will still function to provide a threshold. Such an embodiment requires circuitry (not shown but well known to those of skill in the art) which senses the presence of an ASK signal.

With returning reference to FIGS. 1B, 1C and FIG. 2, the example embodiment of a superheterodyne receiver 28 as described above can be used to resolve the major frequency error as illustrated in FIG. 1C such that the receiver IF signal is essentially aligned with the center frequency CF of the frequency response of the IF filter as illustrated in FIG. 1B. As will be discussed in greater detail below, this is accomplished by adjusting the intermediate frequency to conform to an essentially fixed frequency response of the IF filter 48. Of course, in alternate embodiments, the frequency response of the IF filter can be changed instead of, or in addition to, changing the IF frequency.

With primary reference to FIG. 2, a first operation in the frequency error correction process is to cause the digital controller 34 to output a signal on control bus 86 to cause MUX 82 to select the line 76 input to the demodulator 52. Line 76 also provides the center frequency CF to the IF filter 48 as described previously. Therefore, the center frequency signal applied to the demodulator 52 is the same as the center frequency signal applied to the IF filter. The signal on line 88 is applied to the (optional) low pass filter 96 via MUX 94 and from there to MUX 102 via line 118 and to the ADC 104 via line 132. The ADC 104 therefore digitizes the output of the demodulator 52 to provide a reference voltage that corresponds to the center frequency of the IF filter 48.

At this point in time, it is known what the output voltage level on line 88 will be at the center frequency for the IF filter. It is also known, in this example embodiment, that the output voltage on line 88 will be zero at a zero input frequency and that the relationship between the output voltage and the input frequency of the demodulator 52 is essentially linear. If the relationship is non-linear or the output voltage is not zero at zero input frequency, the calculations are more complex and may require multiple iterations. Therefore, by storing the digitized voltage level as a calibration value in one of the registers 136 of digital controller 34, it is possible for the microcontroller to determine the average input frequency to the demodulator given a detected output voltage on line 88 and vice versa.

This pre-calibration operation of determining the calibration value only needs to be accomplished occasionally, e.g. upon start-up or even at the factory. The number of times that the pre-calibration operation is accomplished, is ultimately, under the control of the user who programs the microcontroller 134 or the like. However, it is anticipated that the pre-calibration operation of determining the calibration value should be performed from time-to-time to compensate for crystal errors such as drift, aging, temperature fluctuations, etc.

Once the superheterodyne receiver 28 has been pre-calibrated by determining the calibration value, frequency error correction can be formed on a more-or-less continuous basis during operation. In the operational mode, the MUX 82 is switched via a command on bus 86 by the digital controller 34 to take the input from line 84 of the RSSI 50. The normal signal path through the heterodyne stage 46, IF filter 48, RSSI 50, demodulator 52, MUX 94, and low pass filter 96 will apply both the inputs and the outputs of threshold generator 98 to both the comparator 100 and the MUX 102. The output of the comparator 100 will develop on line 110 the 0's and 1's (spaces and marks) of the derived signal which may be stored in appropriate registers of the digital controller 34 or may be directly output to the microcontroller 134. The MUX 102 applies the average signal of line 130 to the ADC 104 to produce a digital output (in this case a seven bit output) on line 114 which represents the average of the signal developed at the output 88 of the demodulator 52.

The microcontroller 134 therefore has access to both a calibration value representing the center frequency of the IF filter and the current center value of the receiver IF signal. If the two signals are essentially aligned, as shown in FIG. 1B, there is zero frequency error and nothing needs to be done, however, if there is a frequency error as indicated in FIG. 1C, the microcontroller has the ability to change the intermediate frequency to bring it back in alignment with the center frequency of the IF filter. This is accomplished by controlling the PLL 54 to appropriately shift the intermediate frequency. As will be appreciated by those of skill in the art, more than one iteration may be necessary.

For example, if the steps of the PLL 54 are 300 Hz and if the intermediate frequency is off by 100 KHz, the digital controller 34 is commanded, for example, by the microcontroller 134 to cause a signal on line 92 which causes PLL 54 to make the desired adjustment. Of course, these figures are used by way of example only and PLLs of different types with different step amounts, etc., can be utilized as is appreciated by those of skill in the art, along with other alternatives. Also, as will be appreciated by those of skill in the art, certain PLL designs make it possible to adjust the intermediate frequency directly based upon a digital input or by tuning the crystal oscillator frequency.

Although various embodiments have been described using specific terms and devices, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A receiver having an intermediate frequency error correction circuit comprising:
    a mixer having a source input, a local oscillator input, and an IF output,
    an adjustable frequency local oscillator having an output coupled to the local oscillator input of the mixer;
    an IF filter having an input coupled to the IF output of the mixer and an IF filtered output, where the IF filter has an IF filter frequency response;
    control circuitry coupled to the local oscillator such that the frequency of the local oscillator can be varied to at least partially correct an IF frequency error,
    said control circuitry including a demodulator coupled to the output of the IF filter, an averaging circuit coupled to an output of the demodulator, an ADC coupled to an output of the averaging circuit, and a digital controller coupled to an output of the ADC; and
    a limiting amplifier coupled between the IF filter and the demodulator.

2. A receiver having an intermediate frequency error correction circuit as recited in claim 1 wherein said digital controller has a digital output coupled to the local oscillator to adjust the frequency at the output of the local oscillator.

3. A receiver having an intermediate frequency error correction circuit as recited in claim 2 wherein the local oscillator comprises a tunable PLL controlled by the digital controller and a crystal oscillator.

4. A receiver having an intermediate frequency error correction circuit as recited in claim 1 wherein the averaging circuit is coupled to an output of the demodulator by a low pass filter.

5. A receiver having an intermediate frequency error correction circuit as recited in claim 4 further including a comparator having a first input coupled to an output of the low pass filter, as second input coupled to the output of said averaging circuit, and an output coupled to the digital controller.

6. A receiver having an intermediate frequency error correction circuit as recited in claim 1 further including a MUX having a first input coupled to the limiting amplifier, a second input coupled to a crystal oscillator by a frequency divider and an output coupled to the demodulator.

7. A receiver having an intermediate frequency error correction circuit as recited in claim 6 wherein an output of the frequency divider is coupled to the IF filter.

8. A receiver having an intermediate frequency error correction circuit as recited in claim 1 embodied on an integrated circuit chip.

9. A method to calibrate an IF stage comprising:
   demodulating an IF signal in an FSK demodulator comprising a PLL of an IF stage to develop a demodulated output signal;
   developing a center signal related to said demodulated output signal which represents a center frequency of the demodulated output signal;
   developing a digital center value corresponding to the center signal; and
   changing a frequency derived from a local oscillator based upon a comparison between the center value to a calibration value;
   wherein said center signal is derived by a threshold generator.

10. A method to calibrate an IF stage as recited in claim 9 wherein said digital center value is developed by an ADC.

11. A method to calibrate an IF stage as recited in claim 10 wherein the comparison is made using a microcontroller.

12. A method to calibrate an IF stage as recited in claim 11 wherein said frequency is changed under microcontroller control of a PLL coupled to a crystal oscillator.

* * * * *